United States Patent
Kawano et al.

(10) Patent No.: US 9,704,090 B2
(45) Date of Patent: Jul. 11, 2017

(54) PACKAGE STRUCTURE

(71) Applicant: FUJITSU LIMITED, Kawasaki-shi, Kanagawa (JP)

(72) Inventors: Hiroyasu Kawano, Ebina (JP); Kazuyuki Ozaki, Machida (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/813,161

(22) Filed: Jul. 30, 2015

(65) Prior Publication Data
US 2015/0332140 A1 Nov. 19, 2015

Related U.S. Application Data

(63) Continuation of application No. PCT/JP2013/057734, filed on Mar. 18, 2013.

(51) Int. Cl.
*G06K 19/077* (2006.01)
*H01L 23/373* (2006.01)
*G06K 19/07* (2006.01)
*G06K 19/02* (2006.01)
*H01L 23/29* (2006.01)
*H01L 23/31* (2006.01)
*H01L 23/34* (2006.01)

(52) U.S. Cl.
CPC ......... *G06K 19/0773* (2013.01); *G06K 19/02* (2013.01); *G06K 19/0716* (2013.01); *G06K 19/07775* (2013.01); *H01L 23/293* (2013.01); *H01L 23/3107* (2013.01); *H01L 23/34* (2013.01); *H01L 23/3735* (2013.01); *H01L 2924/0002* (2013.01)

(58) Field of Classification Search
CPC . H01L 23/3735; H01L 23/34; H01L 23/3107; H01L 2924/0002; H01L 23/29; H01L 23/293; G06K 19/0773; G06K 19/07775; G06K 19/0716; G06K 19/02
See application file for complete search history.

(56) References Cited

U.S. PATENT DOCUMENTS

| 7,199,718 B2 * | 4/2007 | Kikuchi | G06K 19/0773 257/787 |
| 2008/0001762 A1 | 1/2008 | Baba et al. | |
| 2014/0015643 A1 * | 1/2014 | Shankman | G06K 19/0773 340/10.1 |

FOREIGN PATENT DOCUMENTS

| JP | 01-135835 | 9/1989 |
| JP | 2001-236485 | 8/2001 |
| JP | 2008-009883 | 1/2008 |

(Continued)

OTHER PUBLICATIONS

JPOA—Office Action mailed on May 31, 2016 issued with respect to the corresponding Japanese Patent Application No. 2015-506413, with partial English translation.

(Continued)

*Primary Examiner* — Sonji Johnson
(74) *Attorney, Agent, or Firm* — Fujitsu Patent Center

(57) ABSTRACT

A package structure includes a first member that surrounds a semiconductor device, a heat insulating material that surrounds an outer side of the first member, and a second member that surrounds an outer side of the head insulating material. The heat insulating material has a density and a thermal conductivity lower than those of the first and second members. The first member has a heat capacity larger than that of the second member.

15 Claims, 18 Drawing Sheets

(56) References Cited

FOREIGN PATENT DOCUMENTS

| JP | 2008-310387 | 12/2008 |
| JP | 2011-123866 | 6/2011 |
| JP | 2011-256107 | 12/2011 |
| JP | 2012-140272 | 7/2012 |
| WO | 2007-147944 | 12/2007 |
| WO | 2012-032696 | 3/2012 |
| WO | 2013/018570 A1 | 2/2013 |

OTHER PUBLICATIONS

International Search Report and Written Opinion of the International Searching Authority (Form PCT/ISA/210, Form PCT/ISA/237), mailed in connection with PCT/JP2013/057734 and mailed Jun. 18, 2013 (8 pages). Partial English translation.

JPOA—Office Action mailed on Dec. 13, 2016 issued with respect to the corresponding Japanese Patent Application No. 2015-506413, with partial English translation of office action.

JPOA—Office Action mailed on Apr. 4, 2017 issued with respect to the corresponding Japanese Patent Application No. 2015-506413, with full machine English translation.

* cited by examiner

PACKAGE STRUCTURE

CROSS-REFERENCE TO RELATED APPLICATIONS

This application is a continuation application of International Application No. PCT/JP2013/057734 filed on Mar. 18, 2013 and designated the U.S., the entire contents of which are incorporated herein by reference.

FIELD

The embodiments discussed herein are related to a package structure.

BACKGROUND

An RFID (Radio Frequency IDentification) tag is sometimes also referred to as a wireless IC (Integrated Circuit) tag, and is used for various purposes. For example, the RFID tag may be used in a high-temperature environment. In a case in which the RFID tag is provided on a component or the like, for example, position information of the RFID tag may be read by a tag reader or the like that reads information stored in the RFID tag, in order to confirm a location of the component or the like. In addition, the tag reader or the like may read log information stored in the RFID tag, in order to confirm a log of use of the module or the like.

In a case in which the RFID tag is provided on a module that is exposed to a high-temperature environment, such as a module or the like arranged in a periphery of an engine, for example, heat insulating measures are preferably taken with respect to a semiconductor device within the RFID tag, because the semiconductor device has a relatively low heat resistance. When no heat insulating measures are taken with respect to the semiconductor device, a guaranteed life for retaining data in a semiconductor memory, for example, may become short, and an operation failure of a semiconductor circuit may occur. Hence, in general, the RFID tag that is used under the high-temperature environment is covered by a package or a heat insulating material, in order to suppress heat transfer to an inside of the RFID tag and delay a temperature rise inside the RFID tag to provide the heat resistance.

In order to improve the heat resistance of the RFID tag, the package or the heat insulating material may be made thick so that the heat transfer to the inside of the RFID tag is further suppressed. However, when the package or the heat insulating material is made thick, a volume of a package structure of the RFID tag becomes large, and as a result, a weight of the package structure increases.

An example of the IC tag is proposed in Japanese Laid-Open Patent Publication No. 2008-310387.

In a conventional package structure, such as a heat-resistant package structure for the RFID tag, it is difficult to improve the heat resistance while maintaining the volume of the package structure unchanged and without increasing the weight of the package structure. In other words, in the conventional package structure, it is difficult to simultaneously reduce the weight and improve the heat resistance, while maintaining the volume of the package structure unchanged.

SUMMARY

Accordingly, it is an object in one aspect of the embodiments to provide a package structure that can simultaneously reduce the weight and improve the heat resistance, while maintaining the volume of the package structure unchanged.

According to one aspect of the embodiments, a package structure includes a first member that surrounds a semiconductor device; a heat insulating material that surrounds an outer side of the first member; and a second member that surrounds an outer side of the head insulating material, wherein the heat insulating material has a density and a thermal conductivity lower than those of the first and second members, and wherein the first member has a heat capacity larger than that of the second member.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be described with reference to the accompanying drawings.

A description will now be given of the package structure in each embodiment according to the present invention.

The disclosed package structure includes a first member surrounding a semiconductor device, a heat insulating material surrounding an outer side of the first member, and a second member surrounding an outer side of the heat insulating material. The heat insulating material has a density and a thermal conductivity lower than those of materials forming the first and second members. In addition, a heat capacity of the first member is larger than that of the second member.

Figure 1:
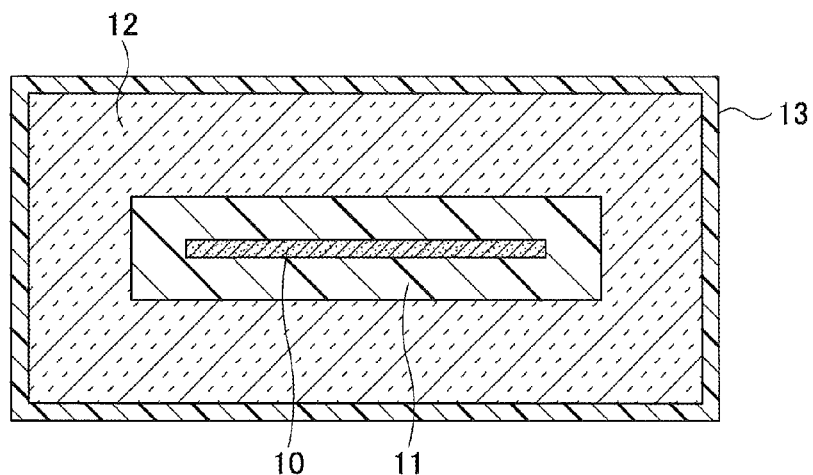
FIG. 1 is a cross sectional view illustrating an example of a package structure in a first embodiment.

FIG. 1 is a cross sectional view illustrating an example of a package structure in a first embodiment. In FIG. 1 and each of the cross sectional views described hereunder, the cross section is taken along a direction perpendicular to top and bottom surfaces of the package structure. In FIG. 1, a package structure 1-1 includes an inner wall 11 surrounding a semiconductor device 10, a heat insulating material 12 surrounding an outer side of the inner wall 11, and an outer wall 13 surrounding an outer side of the heat insulating material 1. The semiconductor device 10 is accommodated within a closed space surrounded by the inner wall 11. In addition, the inner wall 11 and the heat insulating material 12 are accommodated within a closed space surrounded by the outer wall 13. The semiconductor device 10 may include a semiconductor memory (not illustrated) or the like, as will be described later. The inner wall 11 is an example of the first member that is made of a resin or the like, for example. The outer wall 13 is an example of the second member that is made of a resin or the like, for example. The heat insulating material 12 has a density and a thermal conductivity lower than those of materials forming the inner wall 11 and the outer wall 13. In addition, a heat capacity of the inner wall 11 is larger than that of the outer wall 13. Accordingly, the heat transfer to the inside of the package structure 1-1 can be suppressed, and a temperature rise can be delayed to provide the heat resistance. The inner wall 11, the heat insulating material 12, and the outer wall 13 are preferably made of an electrically insulating material. However, a part of the inner wall 11 may be made of an electrically conductive material, and a part of the outer wall 13 may be made of an electrically conductive material.

Figure 2:
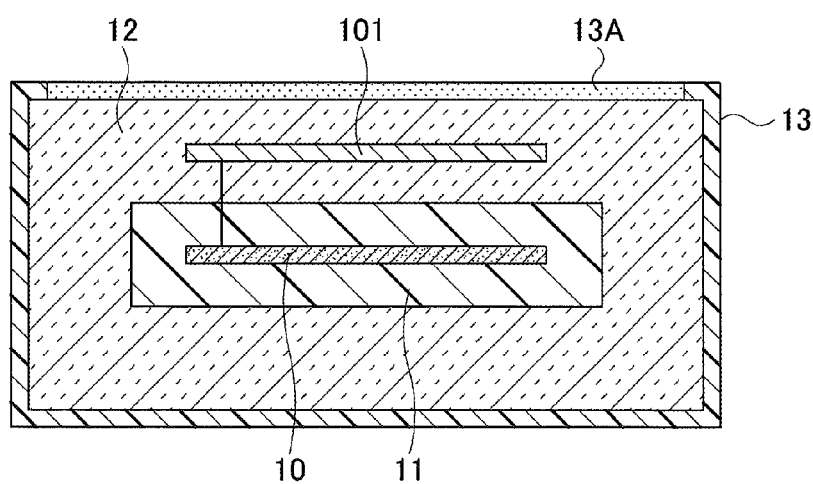
FIG. 2 is a cross sectional view illustrating an example of the package structure in a second embodiment.

FIG. 2 is a cross sectional view illustrating an example of the package structure in a second embodiment. In FIG. 2, those parts that are the same as those corresponding parts in FIG. 1 are designated by the same reference numerals, and a description thereof will be omitted. In FIG. 2, a part 13A of the outer wall 13 of a package structure 1-2 is made of a nonmetallic or nonmagnetic material. In addition, the package structure 1-2 further includes an antenna 101 that is provided on the outer side of the inner wall 11 and on the inner side of the outer wall 13. The antenna 101 is electrically connected to the semiconductor device 10, and is arranged between the inner wall 11 and the nonmetallic or nonmagnetic part 13A. The nonmetallic or nonmagnetic part 13A may be made of ceramics, for example. The antenna 101 may be made of a metal.

Figure 3:
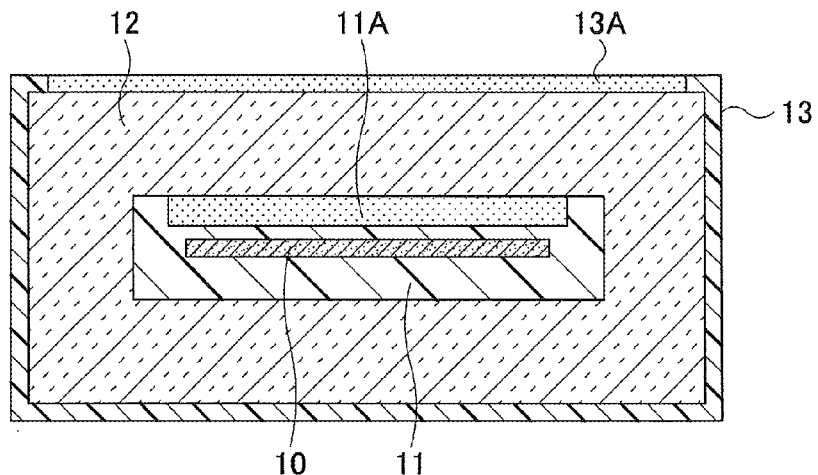
FIG. 3 is a cross sectional view illustrating an example of the package structure in a third embodiment.

FIG. 3 is a cross sectional view illustrating an example of the package structure in a third embodiment. In FIG. 3, those parts that are the same as those corresponding parts in FIG. 2 are designated by the same reference numerals, and a description thereof will be omitted. In FIG. 3, a part 11A of the inner wall 11 of a package structure 1-3 is made of a nonmetallic or nonmagnetic material. The nonmetallic or nonmagnetic part 11A of the inner wall 11 opposes the nonmetallic or nonmagnetic part 13A of the outer wall 13 via the heat insulating material 12. The semiconductor device 10 may include an antenna (not illustrated). The nonmetallic or nonmagnetic part 11A may be made of ceramics, for example.

Figure 4:
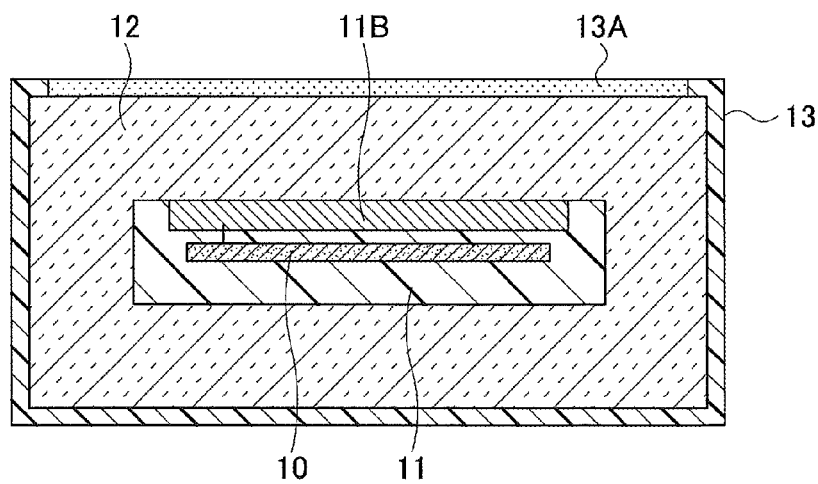
FIG. 4 is a cross sectional view illustrating an example of the package structure in a fourth embodiment.

FIG. 4 is a cross sectional view illustrating an example of the package structure in a fourth embodiment. In FIG. 4, those parts that are the same as those corresponding parts in FIG. 2 are designated by the same reference numerals, and a description thereof will be omitted. In FIG. 4, a part 11B of the inner wall 11 of a package structure 1-4 is made of a metal. The metal part 11B of the inner wall 11 opposes the nonmetallic or nonmagnetic part 13A of the outer wall 13 via the heat insulating material 12. The metal part 11B may be electrically connected to the semiconductor device 10 and form at least a part of an antenna.

Figure 5:
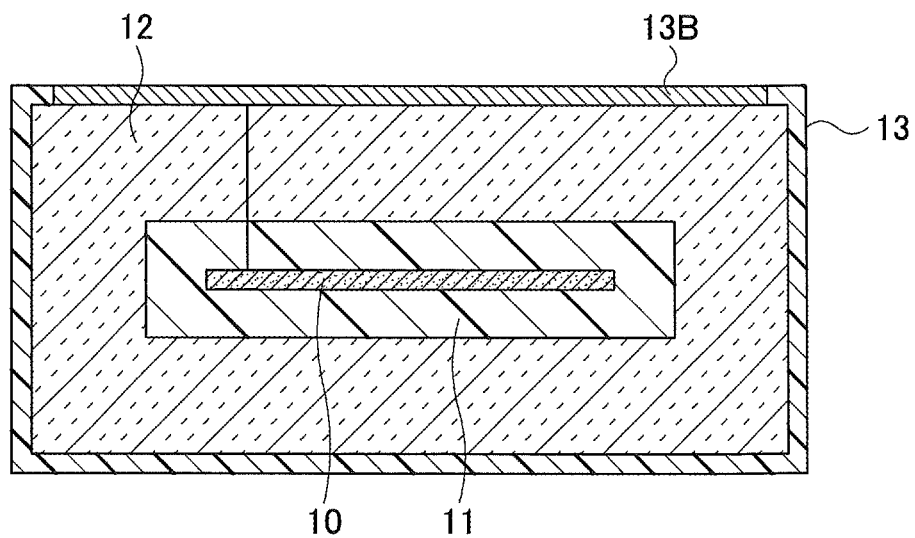
FIG. 5 is a cross sectional view illustrating an example of the package structure in a fifth embodiment.

FIG. 5 is a cross sectional view illustrating an example of the package structure in a fifth embodiment. In FIG. 5, those parts that are the same as those corresponding parts in FIG. 1 are designated by the same reference numerals, and a description thereof will be omitted. In FIG. 5, a part 13B of the outer wall 13 of a package structure 1-5 is made of a metal. The metal part 13B may be electrically connected to the semiconductor device 10 and form at least a part of an antenna or data reading electrodes that are to be used for reading data.

In a case in which the RFID tag is exposed to a high-temperature environment, the semiconductor device that has the relatively low heat resistance is preferably embedded in the inner wall to be protected from the high temperature. On the other hand, the antenna itself is made of a metal, as typified by a loop coil, and there is little deterioration in properties of the antenna even when exposed to the high-temperature environment. Accordingly, the antenna may be embedded in the heat insulating material between the inner wall and the outer wall, as illustrated in FIG. 2. In this case, in order to improve a wireless communication quality, at least a part of the outer wall is preferably made of the nonmetallic or nonmagnetic material, such as ceramics. In addition, in order to improve the wireless communication quality using the antennal provided on the semiconductor device, the nonmetallic or nonmagnetic part of the inner wall may be arranged to oppose the nonmetallic or nonmagnetic part of the outer wall via the heat insulating material, as illustrated in FIG. 3.

The antenna itself is made of a metal, for example. Hence, as illustrated in FIGS. 4 and 5, a part of the inner wall or the outer wall may be made of a metal, and this metal part may be used as the antenna. In a case in which at least a part of the inner wall is made of the metal to form a part of the antenna, at least a part of the outer wall is preferably made of the nonmetallic or nonmagnetic material as illustrated in FIG. 4.

Typical antennas include electric field dipole antennas (including those having meander line shapes obtained by bending linear dipole antennas), and magnetic field loop antennas (including those having spiral shapes or helical shapes), however, the antennas are not limited to such. When an antenna operating frequency is denoted by f (Hz), a length d (m) of the dipole antenna can be represented by $d=(3\times10^8/2f)\times0.96$ to $d=(3\times10^8/2f)\times0.97$. In addition, in the case of the loop antenna, a capacitor for resonance having a capacitance C (F) is connected in series to the antenna, and the loop antenna has an inductance L (H) satisfying a formula $f=\frac{1}{2}\pi(L\times C)^{1/2}$. With respect to the inductance L of the loop antenna, the capacitor for resonance that is used may have the capacitance C satisfying the above described formula of the operating frequency f. The antenna may be made of a metal such as copper or the like, and may be formed by a copper wire, for example. The antenna may be lines formed by a metal film or a meta layer on a base material, such as a printed circuit.

Figure 6:
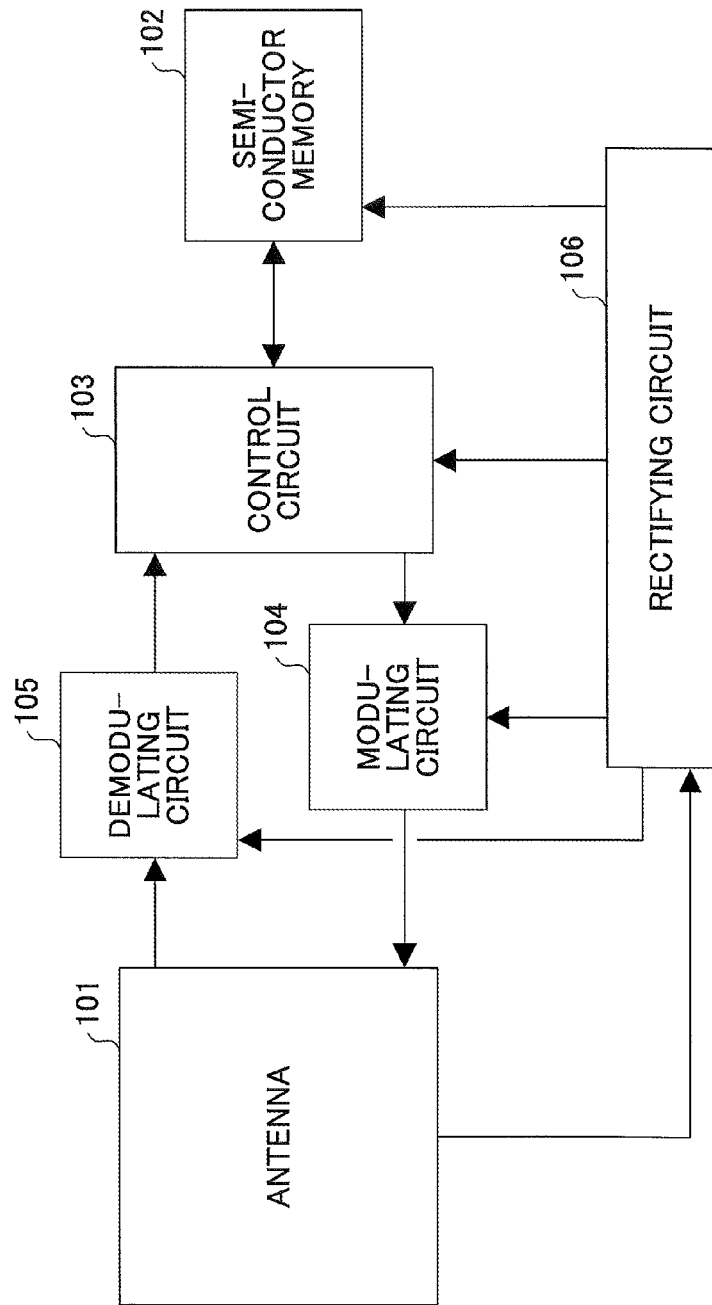
FIG. 6 is a block diagram illustrating a first example of a semiconductor device.

FIG. 6 is a block diagram illustrating a first example of the semiconductor device. A passive RFID tag 10-1 illustrated in FIG. 6 is an example of the semiconductor device 10, and includes an antenna 101, a semiconductor memory 102, a control circuit 103, a modulating circuit 104, a demodulating circuit 105, and a rectifying circuit 106. The demodulating circuit 105 obtains a data component from radio waves received via the antenna 101, and supplies demodulated data to the control circuit 103. The control circuit 103 stores the demodulated data in the semiconductor memory 102. The control circuit 103 supplies the data stored in the semiconductor memory 102 to the modulating circuit 104, and modulated data from the modulating circuit 104 is transmitted via the antenna 101. The rectifying circuit 106 obtains a current from the radio waves received via the antenna 101 and generates power that is supplied to each part within the semiconductor device 10-1. In this example, the power generated from the current obtained by the microwave technique is supplied to each part within the semiconductor device 10-1. However, other techniques, such as an electromagnetic induction technique that obtains the current using induced electromotive force between coils, for example, may be used to generate and supply the power to each part within the semiconductor device 10-1.

Figure 7:
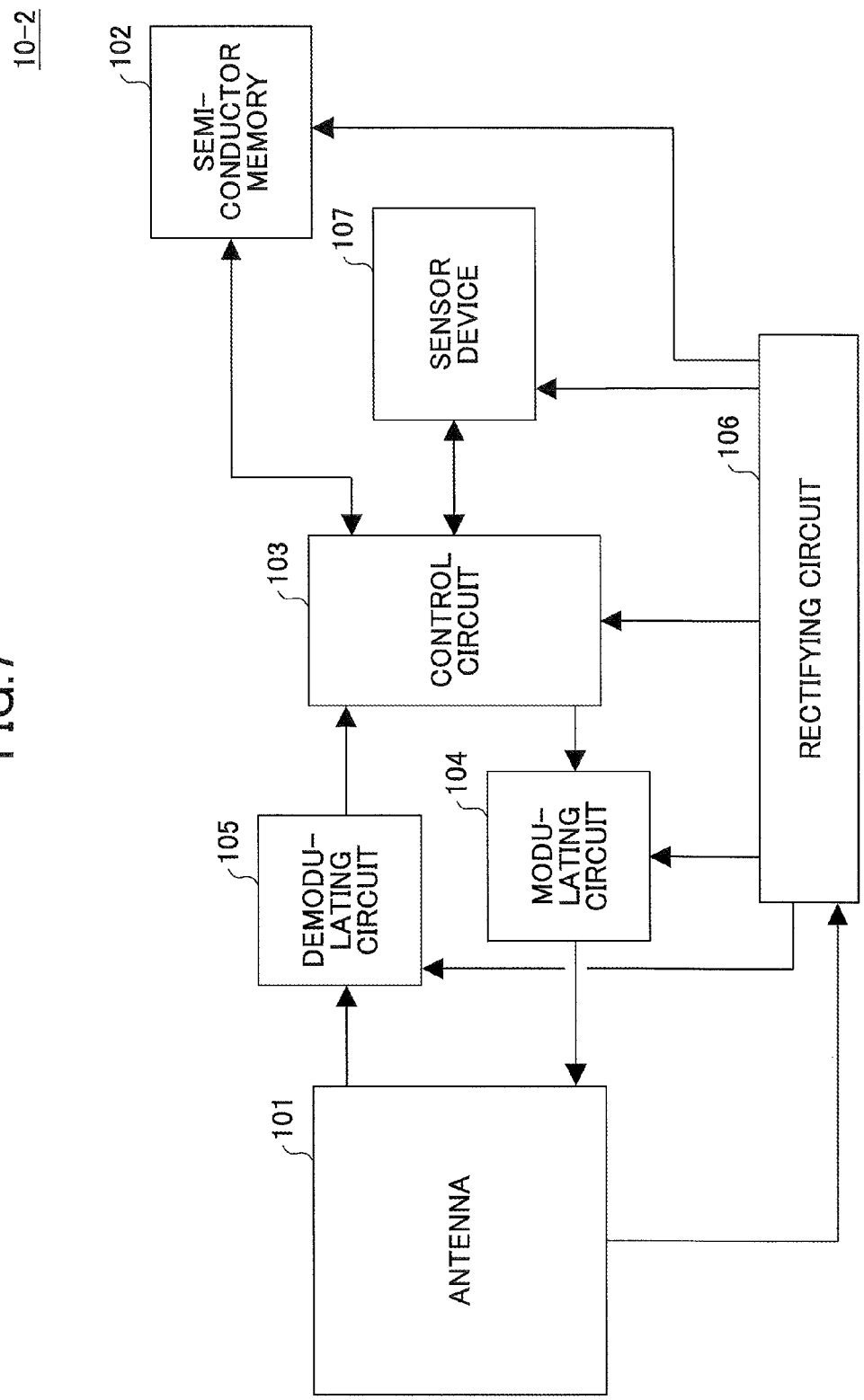
FIG. 7 is a block diagram illustrating a second example of the semiconductor device.

FIG. 7 is a block diagram illustrating a second example of the semiconductor device. In FIG. 7, those parts that are the same as those corresponding parts in FIG. 6 are designated by the same reference numerals, and a description thereof will be omitted. A passive RFID tag 10-2 illustrated in FIG. 7 is an example of the semiconductor device 10, and includes one or a plurality of sensor devices 107. The sensor device 107 is not limited to a particular type of sensor. For example, the sensor device 107 may be formed by a temperature sensor, a vibration sensor, an acceleration sensor, or the like. In addition, the plurality of sensor devices 107 may be formed by a combination of two or more different types of sensors. Information detected by the sensor device 107 may be transmitted via the modulating circuit 104 and the antenna 101 under a control of the control circuit 103, or temporarily written into the semiconductor device 102 and then read out to be transmitted. The semiconductor memory 102 may be omitted.

Figure 8:
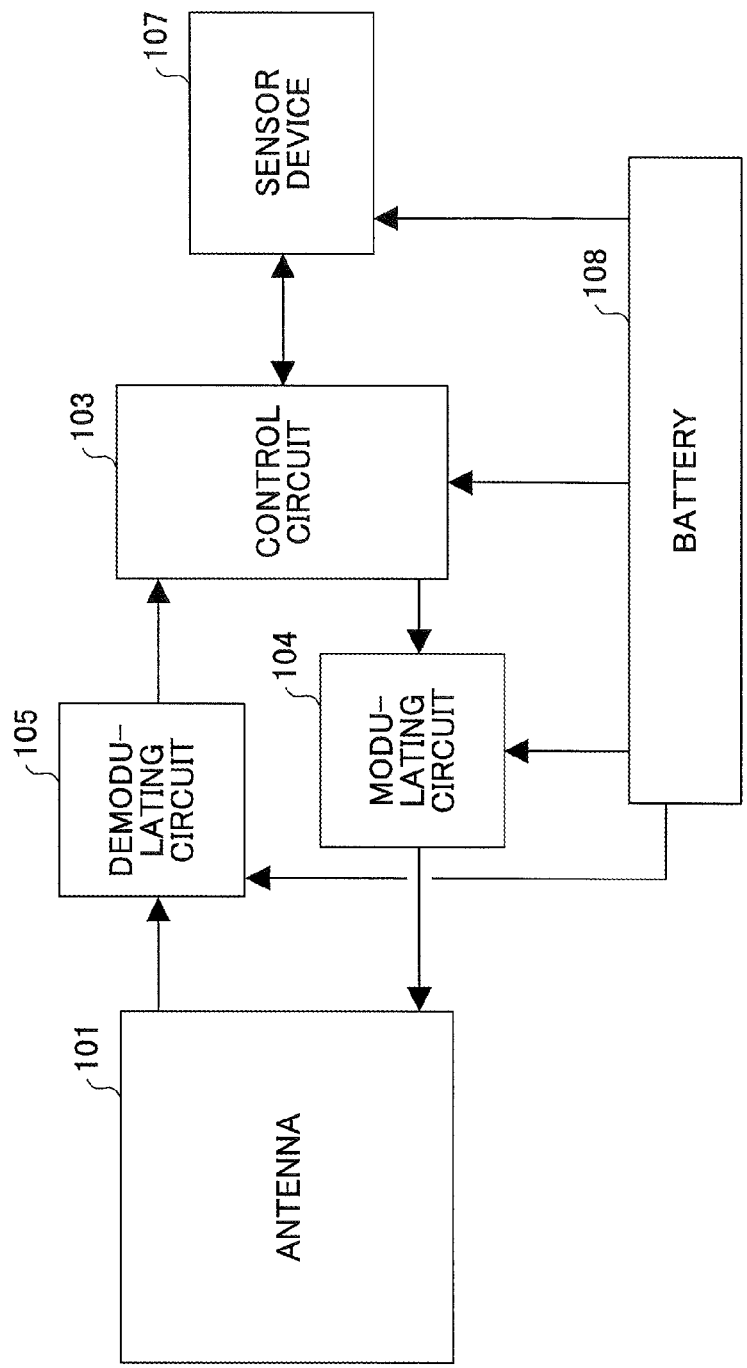
FIG. 8 is a block diagram illustrating a third example of the semiconductor device.

FIG. 8 is a block diagram illustrating a third example of the semiconductor device. In FIG. 8, those parts that are the same as those corresponding parts in FIG. 7 are designated by the same reference numerals, and a description thereof will be omitted. An active RFID tag 10-3 illustrated in FIG. 8 is an example of the semiconductor device 10, and includes a battery 108. The battery 108 supplies power to each part within the semiconductor device 10-3. The RFID tag 10-3 may include the semiconductor memory 102 illustrated in FIG. 7.

Figure 9:
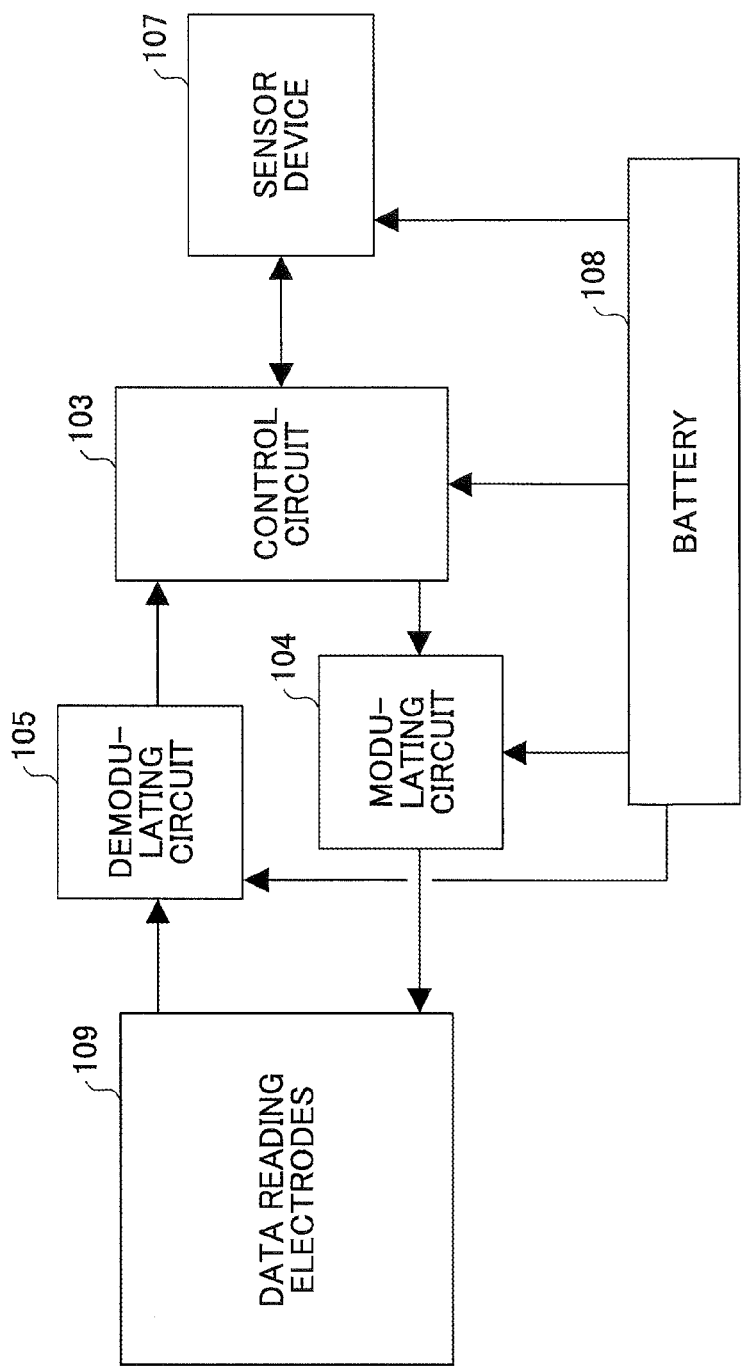
FIG. 9 is a block diagram illustrating a fourth example of the semiconductor device.

FIG. 9 is a block diagram illustrating a fourth example of the semiconductor device. In FIG. 9, those parts that are the same as those corresponding parts in FIG. 8 are designated by the same reference numerals, and a description thereof will be omitted. An active RFID tag 10-4 illustrated in FIG. 9 is an example of the semiconductor device 10, and further includes data reading electrodes 109 in place of the antenna 101. The RFID tag 10-4 may include the semiconductor memory 102 illustrated in FIG. 7.

In FIGS. 6 through 9, a processor, such as a CPU (Central Processing Unit) or the like, may be provided in place of the control circuit 103. In this case, the semiconductor memory 102 may store programs to be executed by the CPU, intermediate data of operations or computations performed by the CPU, various parameters used for the operations or computations performed by the CPU, or the like.

The outer wall of the package structure is provided to hold the heat insulating material. Preferably, the thickness of this outer wall is relatively thin for the reasons described hereunder.

It is conceivable to make the outer wall thick in order to improve the heat resistance of the package structure. However, in a case in which a distance between the outer wall and the semiconductor device on the inside (or the inner wall) is fixed, the package structure becomes large when the outer wall is made thick. On the other hand, when the size (hereinafter also referred to as a "package size") of the package structure is fixed, the distance between the outer wall and the semiconductor device on the inside (or the inner wall) becomes short when the outer wall is made thick.

As will be described in conjunction with FIG. 10 and subsequent figures, the present inventors have found that, when viewed from the inside of the package structure, the outer wall that is heated (that is, accumulates thermal energy) when the package structure is exposed to the high-temperature environment, becomes a heat source. For this reason, in a case in which the package size is fixed, the outer wall becomes closer to the inner wall when the outer wall is made thick, and the heat source becomes closer to the inner part of the package structure, thereby making it easier for the temperature inside the package structure to rise. The present inventors have found that, in the case in which the package size is fixed, the outer wall is preferably made thin, that is, the heat source is preferably farther away from the inner part of the package structure, in order to delay the temperature rise inside the package structure.

In addition, the present inventors found that the package structure can be made lighter and the temperature rise can be delayed by suppressing the thermal energy transfer per unit time to the inside of the package structure, by replacing a part of the outer wall or the inner wall by a heat insulating material having a density and a thermal conductivity lower than those of the materials forming the outer wall and the inner wall of the package structure.

Furthermore, the present inventors found that the heat resistance of the package structure can be improved by increasing the heat capacity of the inner wall. It may be regarded that, in a case in which a substance having a large heat capacity is located at an intermediate part of a thermal energy transfer path, consumption of the thermal energy occurs with a priority over a temperature rise of this substance, to thereby delay the heat transfer beyond this substance and consequently delay the temperature rise inside the package structure.

Accordingly, even under a usage in which the package structure accommodating the semiconductor device is exposed to the high-temperature environment, the temperature rise inside the package structure is delayed. As a result, the heat resistance of the package structure can be improved to increase the life of the semiconductor device, or to avoid an operation failure of the semiconductor device.

Next, a description will be given of simulation results on the heat resistance, weight, or the like of a package structure that is used as a reference (hereinafter also referred to as a "reference package structure") and various package structures, by referring to FIGS. 10 through 25. In FIGS. 10 through h13, 15, 16, 19, 20, 23, and 24, those parts that are the same as those corresponding parts in FIGS. 1 through 5 are designated by the same reference numerals, and a description thereof will be omitted. In FIGS. 10 through 13, 15, 16, 19, 20, 23, and 24, for the sake of convenience, each package structure has a cylindrical structure having a diameter of 40 mm and a thickness of 20 mm, and silicon (hereinafter also referred to as "silicon device") corresponding to the semiconductor device and used for the simulation is a cylindrical structure having a radius of 5 mm and a thickness of 0.5 mm. However, the shape of the package structure and the semiconductor device (and silicon device) is not limited to the cylindrical shape, and the shape may be a parallelepiped shape or the like. In FIGS. 10 through 13, 15, 16, 19, 20, 23, and 24, "x" denotes an observation point within the silicon device. For the sake of convenience, the observation point x in the described examples is located at a central part within the silicon device.

Figure 10:
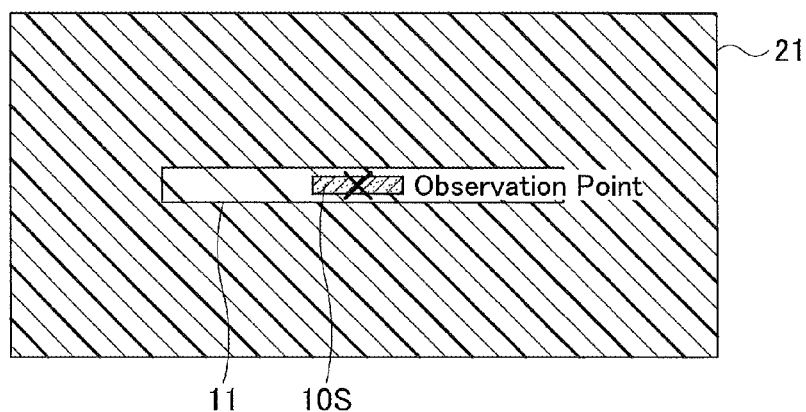
FIG. 10 is a cross sectional view illustrating an example of a reference package structure.

An outer wall 21 of a reference package structure 201 illustrated in FIG. 10 has a thickness of 10 mm, a total weight of the reference package structure 201 is 32.7 g, and no inner wall and no heat insulating material are provided. In a package structure 1-11 illustrated in FIG. 11, the thickness of the inner wall 11 is 1 mm, the thickness of the heat insulating material 12 is 8 mm, the thickness of the outer wall 13 is 1 mm, and the total weight of the package structure 1-11 is 11.2 g. In a package structure 1-12 illustrated in FIG. 12, the thickness of the inner wall 11 is 1 mm, the thickness of the heat insulating material 12 is 6 mm, the thickness of the outer wall 13 is 3 mm, and the total weight of the package structure 1-12 is 19.6 g. In a package structure 1-13 illustrated in FIG. 13, the thickness of the inner wall 11 is 3 mm, the thickness of the heat insulating material 12 is 6 mm, the thickness of the outer wall 13 is 1 mm, and the total weight of the package structure 1-13 is 13.9 g. In FIGS. 10 through 13, the inner wall and the outer wall 13 are made of a resin. In the following description, it is assumed that for the resin, the thermal conductivity is 0.26 W/m/K, the heat capacity is 1.74 J/cm$^3$/K, and the density is 1.30 g/cm$^3$. It is also assumed that for the heat insulating material 12, the thermal conductivity is 0.028 W/m/K, the heat capacity is 0.19 J/cm$^3$/K, and the density is 0.21 g/cm$^3$. In other words, compared to the resin, the heat insulating material 12 has a lower density, a lighter weight, and a lower thermal conductivity. It is assumed that for the silicon, the thermal conductivity is 148 W/m/K, the heat capacity is 1.65 J/cm$^3$/K, and the density is 2.33 g/cm$^3$. In the simulation that performs a known thermal analysis, an initial temperature of the package structures 201, and 1-11 through 1-13 is 30° C., and the temperature is obtained at the observation point x by arranging the package structures 201, and 1-11 through 1-13 in an environment in which the temperature on the outside is 200° C. and constant. The simulation may be performed by a general-purpose computer, for example.

Figure 11:
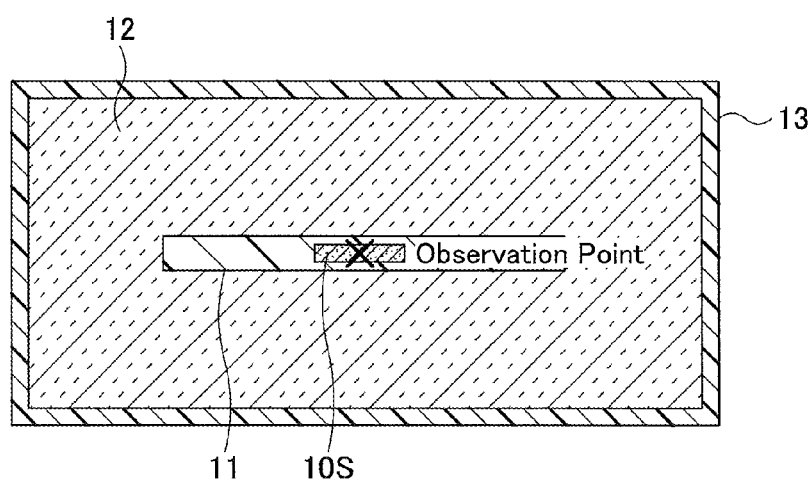
FIG. 11 is a cross sectional view illustrating an example of the package structure.
Figure 12:
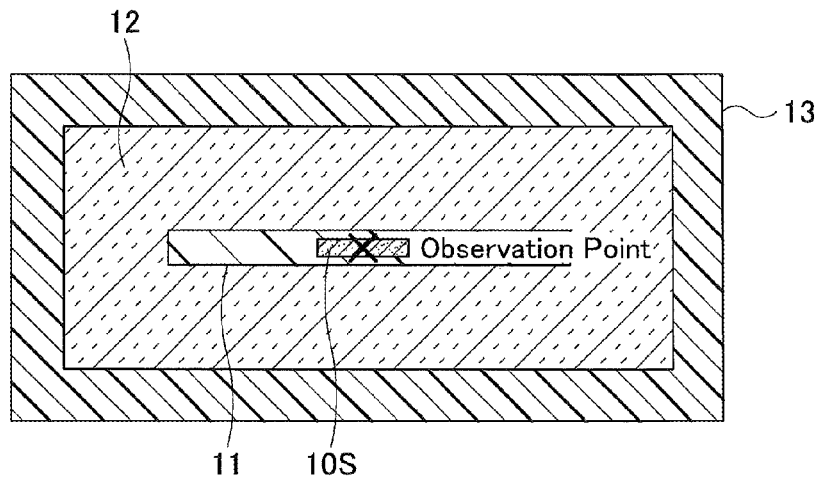
FIG. 12 is a cross sectional view illustrating an example of the package structure.
Figure 13:
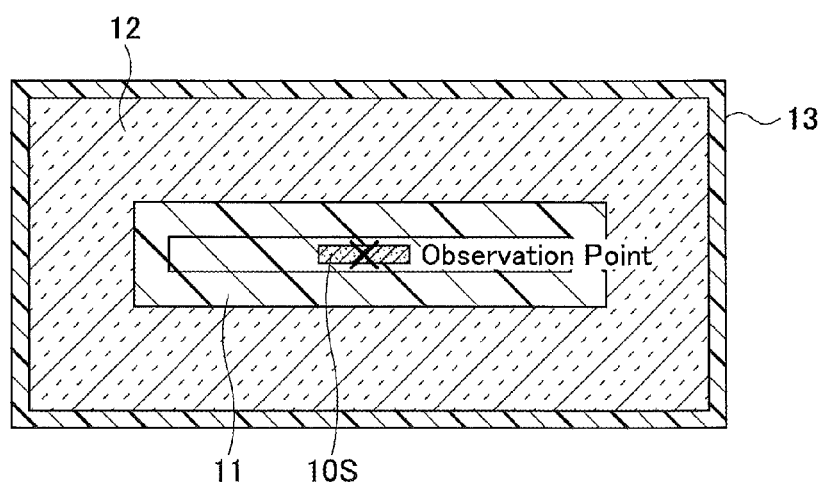
FIG. 13 is a cross sectional view illustrating an example of the package structure.
Figure 14:
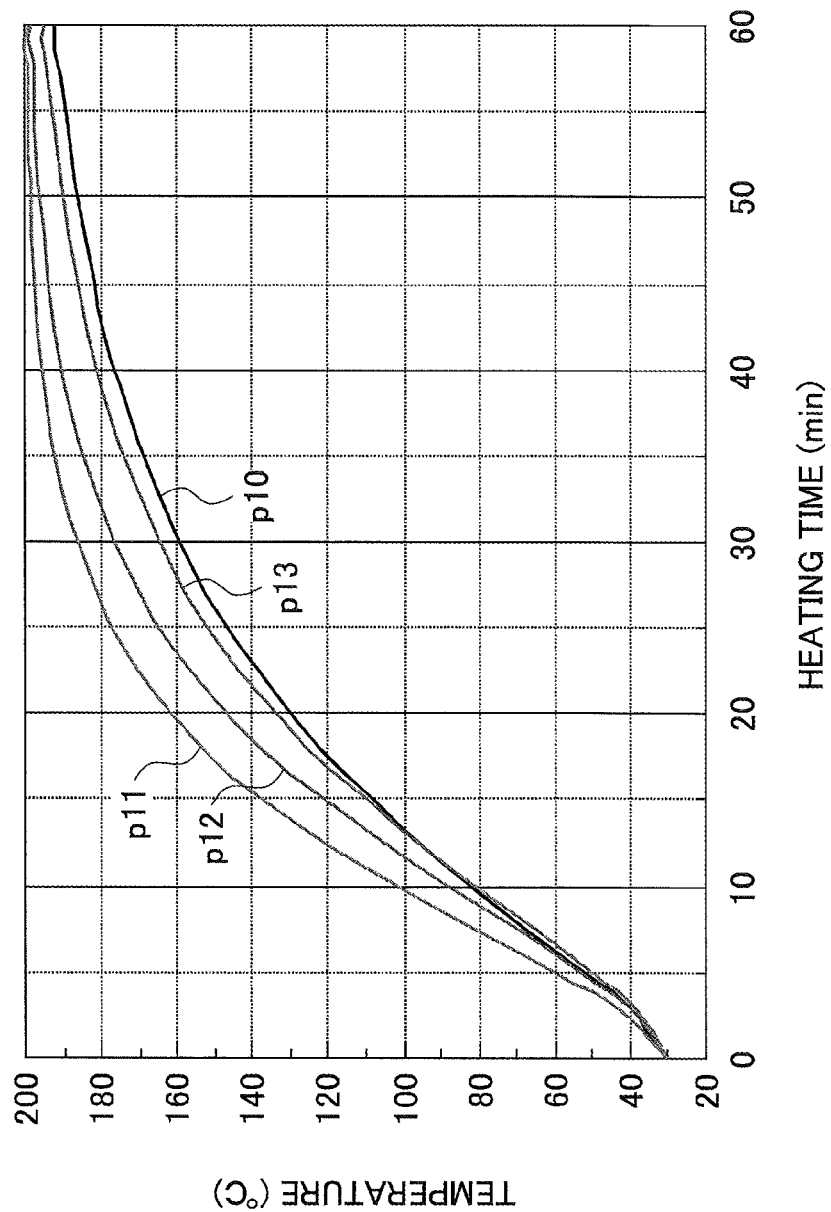
FIG. 14 is a diagram illustrating a relationship between a heating time and a temperature at an observation point for the package structures illustrated in FIGS. 10 through 13.

FIG. 14 is a diagram illustrating a relationship between a heating time and the temperature at the observation point x for the package structures 201, and 1-11 through 1-13 illustrated in FIGS. 10 through 13. In FIG. 14, the ordinate indicates the temperature (° C.) at the observation point x, and the abscissa indicates the heating time (min: minutes). In FIG. 14, p10 through p13 indicate the simulation results of the temperature at the observation point x for the package structures 201, and 1-11 through 1-13 illustrated in FIGS. 10 through 13. As illustrated in FIG. 14, it was confirmed that the package structure 1-13 can simultaneously achieve light weight and heat resistance, by making the wall thick at the part closer to a silicon device 10S, that is, by making the inner wall 11 thick as illustrated in FIG. 13. In the case of the package structure 1-13 illustrated in FIG. 13, the total weight is 13.9 g and is light compared to the total weight (32.7 g) of the reference package structure 201, and the heat resistance indicated by p13 in FIG. 14 is close to the heat resistance (p10) of the reference package structure 201 illustrated in FIG. 14. On the other hand, in the case of the package structures 1-11 and 1-12 illustrated in FIGS. 11 and 12, it was confirmed that the total weights are 11.2 g and 10.6 g, respectively, and are light compared to the total weight (32.7 g) of the reference package structure 201, but the heat resistances indicated by p11 and p12 in FIG. 14 are deteriorated from the heat resistance (p10) of the reference package structure 201 illustrated in FIG. 14.

The thickness of the outer wall 13 of the package structure 1-12 illustrated in FIG. 12 is 3 times that of the package structure 1-11 illustrated in FIG. 11, but the thicknesses of the inner wall 11 are the same for the package structures 1-12 and 1-11. Hence, the temperature rise at the observation point x is slower for the package structure 1-12 illustrated in FIG. 12 than the package structure 1-11 illustrated in FIG. 11. Consumption of the heat transferred from outside the package structures 1-11 through 1-13 occurs with a priority over the temperature rise of the outer wall 13. In other words, the outer wall 13 functions as a thermal buffer with respect to the heat transfer from the outside to the inside of the package structures 1-11 through 1-13. Accordingly, the package structure 1-12 illustrated in FIG. 12 having the thick outer wall 13 (that is, the outer wall 13 having a large heat capacity as a whole) can cause a time delay of the heat transfer to the inside of the package structure 1-12, and cause a slower temperature rise at the observation point x.

The thickness of the outer wall 13 of the package structure 1-12 illustrated in FIG. 12 is the same as the thickness of the inner wall 11 of the package structure 1-13 illustrated in FIG. 13, and a sum of the thicknesses of the outer wall 13 and the inner wall 11 is the same for the package structures 1-12 and 1-13. Hence, the temperature rise at the observation point x is slower for the package structure 1-13 illustrated in FIG. 13 than the package structure 1-12 illustrated in FIG. 12. When viewed from the observation point x of the package structure 1-12 illustrated in FIG. 12, the heated outer wall 13 becomes a new heat source, and this heat source is closer to the observation point x when compared to the package structure 1-13 illustrated in FIG. 13. For this reason, the temperature rise at the observation point x is faster for the package structure 1-12 illustrated in FIG. 12 than the package structure 1-13 illustrated in FIG. 13.

From the simulation results described above, it was confirmed that, although the heat resistance is not as high as that of the reference package structure 201, employing the two-wall structure made up of the outer wall 13 and the inner wall 11 and making the wall (inner wall 11) at the part closer to the central part of the package structure 1-13 thick as illustrated in FIG. 13 have the effect of delaying the temperature rise (or improving the heat resistance).

In the package structures 1-11 through 1-13 illustrated in FIGS. 11 through 13, the resin may be replaced by a light-weight heat insulating material (that is, heat insulating material having a relatively light weight). In this case, the package structures 1-11 through 1-13 can be made lighter in weight than the reference package structure 201 that uses the resin.

Figure 15:
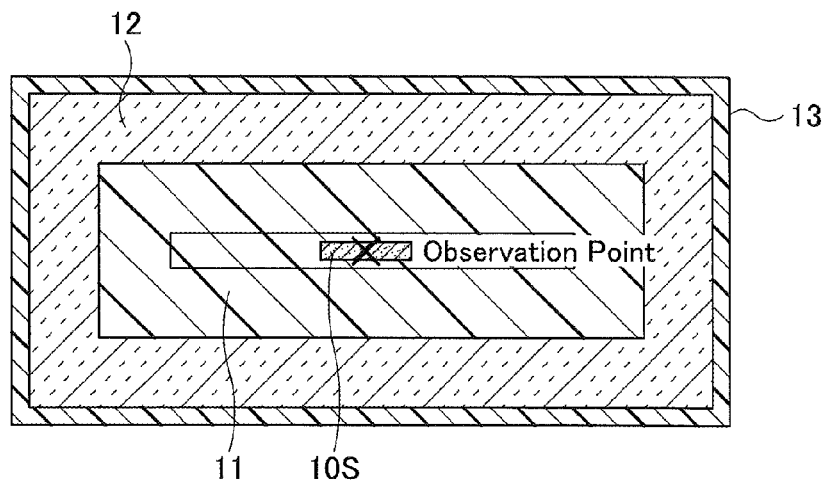
FIG. 15 is a cross sectional view illustrating an example of the package structure.
Figure 16:
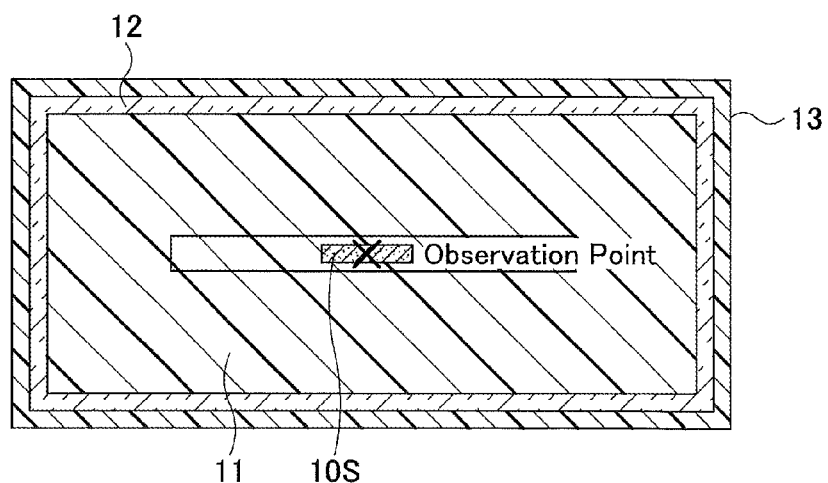
FIG. 16 is a cross sectional view illustrating an example of the package structure.

Next, in a package structure 1-15 illustrated in FIG. 15, the thickness of the inner wall 11 is 5 mm, the thickness of the heat insulating material 12 is 4 mm, and the thickness of the outer wall 13 is 1 mm. In a package structure 1-16 illustrated in FIG. 16, the thickness of the inner wall 11 is 8 mm, the thickness of the heat insulating material 12 is 1 mm, and the thickness of the outer wall 13 is 1 mm. In FIGS. 15 and 16, the silicon device 10S is made of silicon, and the inner wall 11 and the outer wall 13 are made of the resin. In simulations that perform the known thermal analysis, an initial temperature of the package structures 201, 1-15, and 1-16 is 30° C., and the temperature at the observation point x is obtained by arranging the package structures 201, 1-15, and 1-16 in an environment in which the temperature on the outside is 200° C. and constant.

Figure 17:
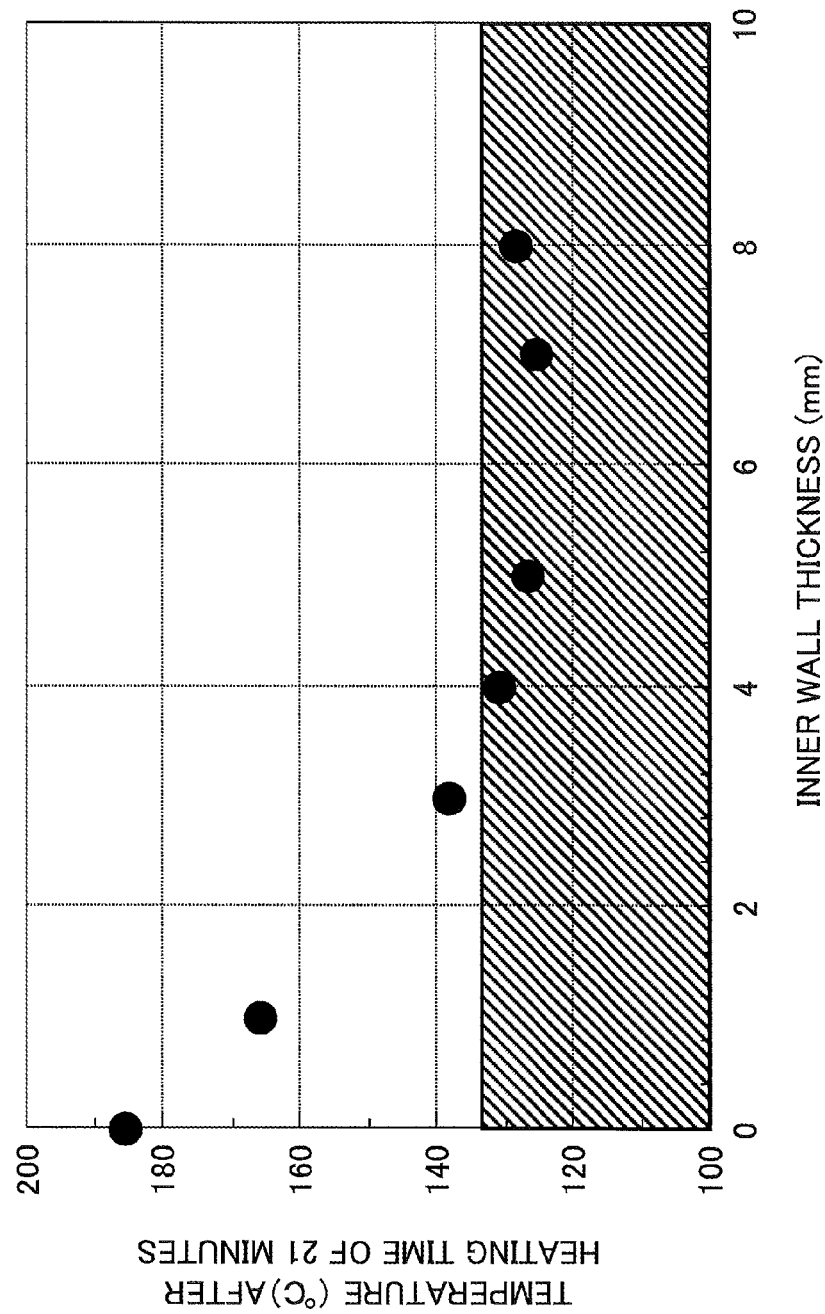
FIG. 17 is a diagram illustrating a relationship between the temperature and an inner wall thickness at an observation point x after a heating time of 21 minutes, for the package structures illustrated in FIGS. 11, 15, and 16.

FIG. 17 is a diagram illustrating a relationship between the temperature and the inner wall thickness (thickness of the inner wall 11) at the observation point x after the heating time of 21 minutes, for the package structures 1-11, 1-15, and 1-16 illustrated in FIGS. 11, 15, and 16. In FIG. 17, a region in which data indicated by hatchings are surrounded by a bold solid line indicates a region in which the temperature is lower than or equal to that at the observation point x of the reference package structure 201 when a similar simulation is performed for the reference package structure 201. Accordingly, in this example, it was confirmed that the temperature can be suppressed to approximately 135° C. or lower when the inner wall thickness is 3 mm to 8 mm.

Figure 18:
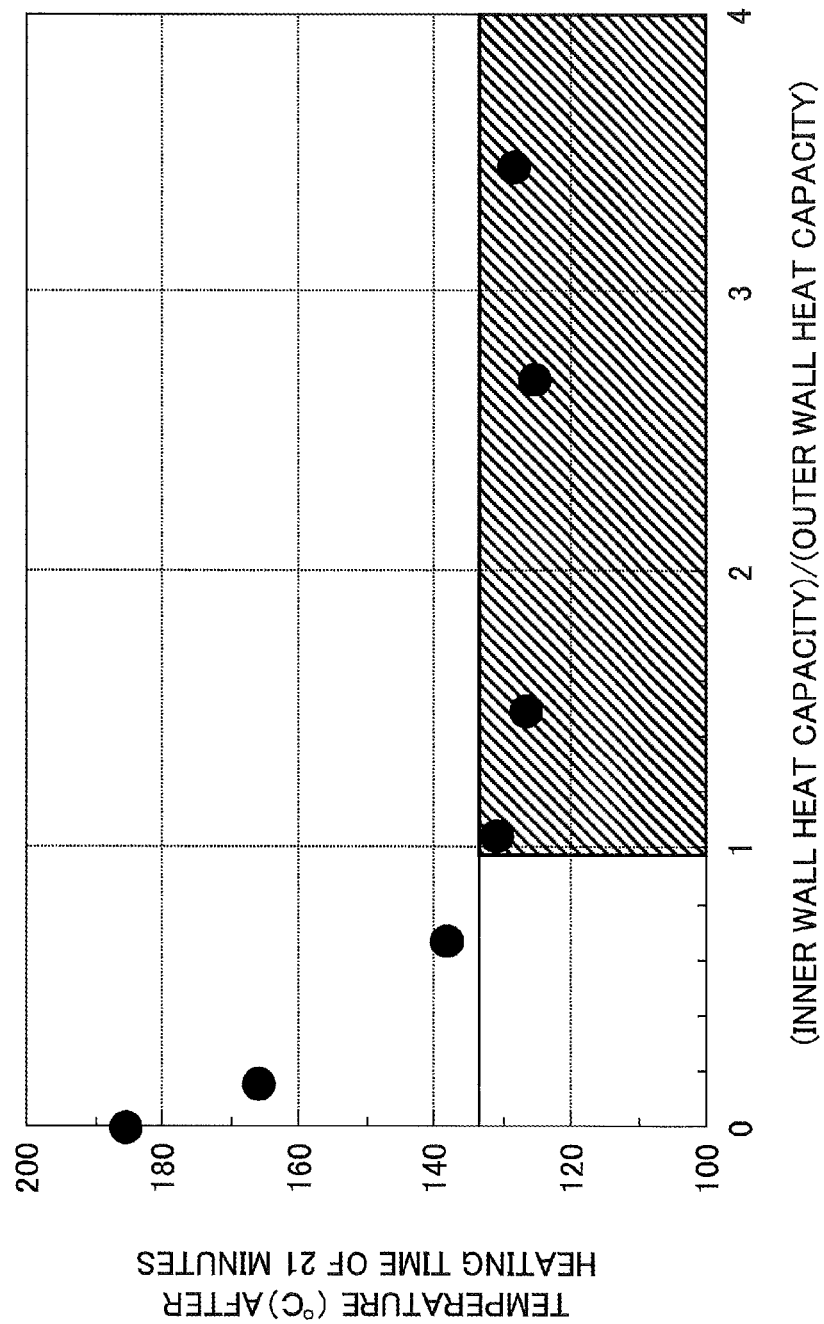
FIG. 18 is a diagram illustrating a relationship between the temperature and a ratio of an inner wall heat capacity and an outer wall heat capacity at the observation point x after the heating time of 21 minutes, for the package structures illustrated in FIGS. 11, 15, and 16.

FIG. 18 is a diagram illustrating a relationship between the temperature and a ratio of an inner wall heat capacity and an outer wall heat capacity at the observation point x after the heating time of 21 minutes, for the package structures 1-11, 1-15, and 1-16 illustrated in FIGS. 11, 15, and 16. The inner wall heat capacity represents the heat capacity of the inner wall 11, and the outer wall heat capacity represents the heat capacity of the outer wall 13. In FIG. 18, a region in which data indicated by hatchings are surrounded by a bold solid line indicates a region in which the temperature is lower than or equal to that at the observation point x of the reference package structure 201 when a similar simulation is performed for the reference package structure 201. Accordingly, in this example, it was confirmed that the temperature can be suppressed to approximately 135° C. or lower when the ratio of the inner wall heat capacity and the outer wall heat capacity (that is, "inner wall heat capacity"/"outer wall heat capacity") is greater than 1, that is, the inner wall heat capacity is larger than the outer wall heat capacity.

The package structures 1-11, 1-15, and 1-16 illustrated in FIGS. 11, 15, and 16 have the same package size as the reference package structure 201, have the thickness of the outer wall 13 fixed to 1 mm, and have the thickness of the inner wall 11 that is varied. When the temperatures at the observation points x of the package structures 201, 1-11, 1-15, and 1-16 after a predetermined time from a start of heating are compared, it was confirmed that the temperature that is reached after the predetermined time becomes lower as the inner wall 11 becomes thicker. In this example, when the thickness of the inner wall 11 is 4 mm or thicker, the temperatures at the observation points x of the package structures 1-11, 1-15, and 1-16 become lower than that at the observation point x of the reference package structure 201. When the ratio of the heat capacity of the outer wall 13 with respect to the heat capacity of the inner wall 11 is regarded as a parameter, and the temperatures at the observation points x are compared using this parameter, it was confirmed that the temperatures at the observation points x of the package structures 1-11, 1-15, and 1-16 become lower than that at the observation point x of the reference package structure 201 in the case in which the heat capacity of the inner wall 11 is larger than the heat capacity of the outer wall 13.

From the simulation results of FIGS. 17 and 18, in the case in which the package size is constant, it was confirmed that, from the viewpoint of improving the heat resistance, the inner wall thickness is preferably thicker than the outer wall thickness, and the inner wall heat capacity is preferably larger than the outer wall heat capacity.

In the package structures 1-11, 1-15, and 1-16 illustrated in FIGS. 11, 15, and 16, the resin may be replaced by a light-weight heat insulating material. In this case, the package structures 1-11, 1-15, and 1-16 can be made lighter in weight than the reference package structure 201 that uses the resin.

Figure 19:
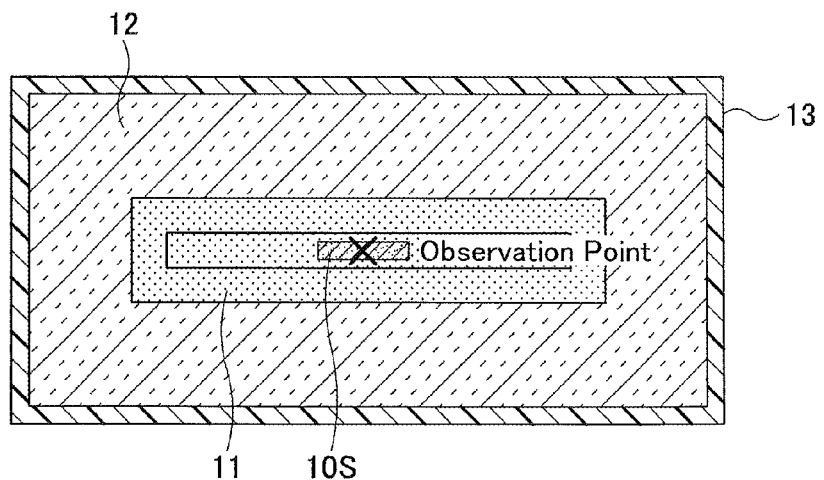
FIG. 19 is a cross sectional view illustrating an example of the package structure.
Figure 20:
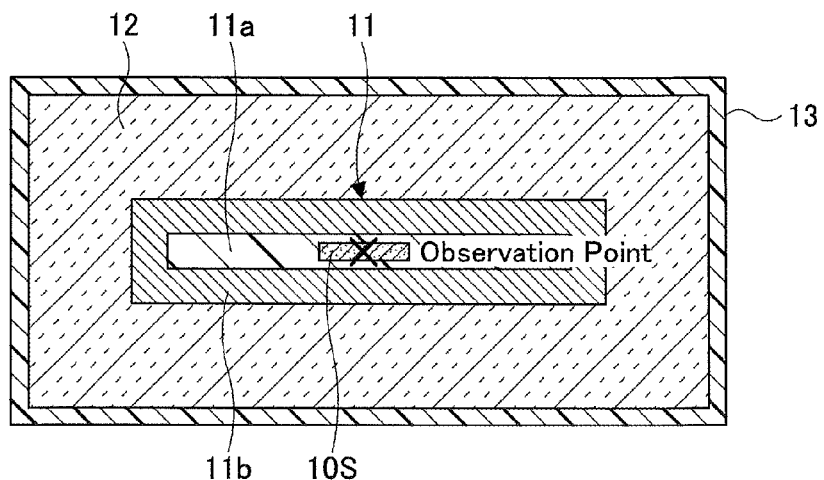
FIG. 20 is a cross sectional view illustrating an example of the package structure.

Next, in the package structure 1-13 illustrated in FIG. 13, the heat capacity of the inner wall 11 made of the resin is 5.5 J/K, and the heat capacity of the outer wall 13 made of the resin is 8.2 J/K. In a package structure 1-19 illustrated in FIG. 19, the heat capacity of the inner wall 11 made of ceramics is 9.7 J/K, the thickness of the inner wall 11 is 3 mm, the thickness of the heat insulating material 12 is 6 mm, the heat capacity of the outer wall 13 made of the resin is 8.2 J/K, the thickness of the outer wall 13 is 1 mm, and the total weight of the package structure 1-19 is 21.9 g. In a package structure 1-20 illustrated in FIG. 20, the thickness of a resin inner part 11a of the inner wall 11 is 1 mm, a metal outer part 11b of the inner wall 11 is 2 mm, the heat capacity of the inner wall 11 as a whole is 11.0 J/K, the thickness of the heat insulating material 12 is 6 mm, the heat capacity of the outer wall 13 made of the resin is 8.2 J/K, the thickness of the outer wall 13 is 1 mm, and the total weight of the package structure 1-20 is 30.1 g. In FIGS. 13, 19, and 20, it is assumed that the ceramics has a thermal conductivity of 33 W/m/K, a heat capacitance of 3.04 J/cm$^3$/K, and a density of 3.80 g/cm$^3$. Further, it is assumed that the metal forming the metal outer part 11b has a thermal conductivity of 16 W/m/K, a heat capacitance of 3.98 J/cm$^3$/K, and a density of 7.93 g/cm$^3$. In simulations that perform the known thermal analysis, an initial temperature of the package structures 1-13, 1-19, and 1-20 is 30° C., and the temperature at the observation point x is obtained by arranging the package structures 1-13, 1-19, and 1-20 in an environment in which the temperature on the outside is 200° C. and constant.

Figure 21:
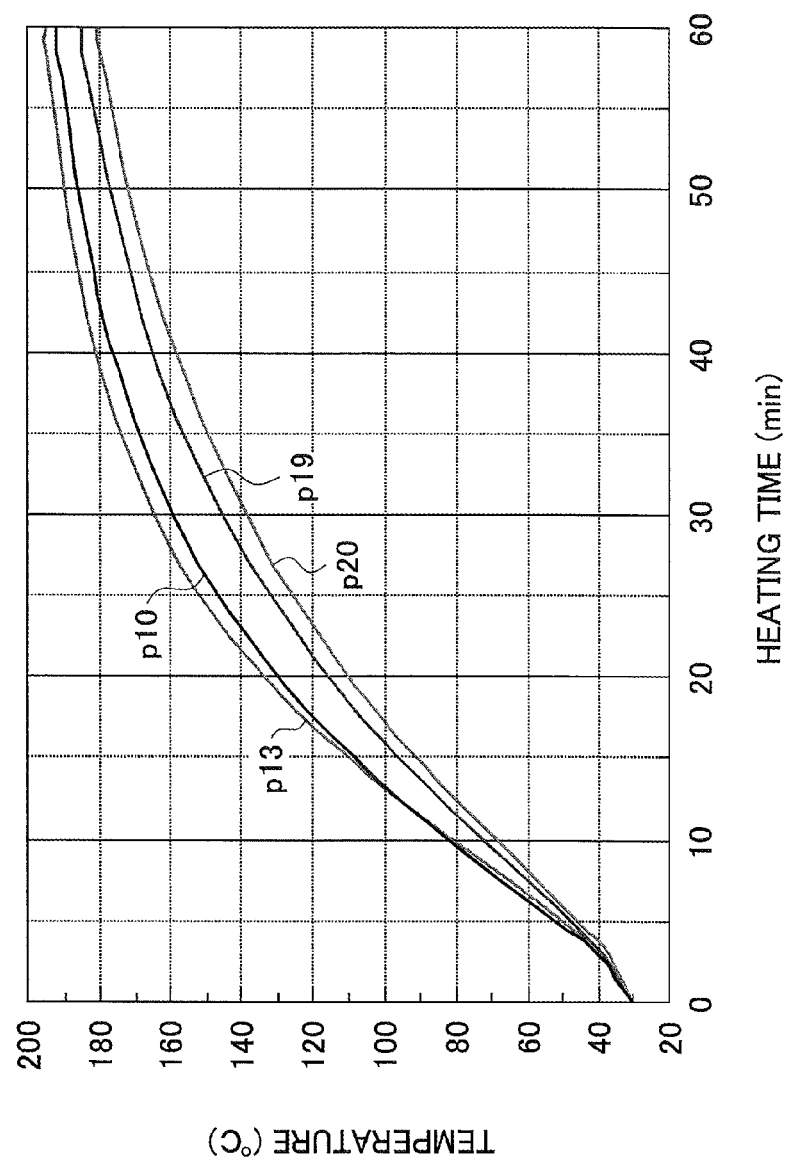
FIG. 21 is a diagram illustrating a relationship between the heating time and the temperature at the observation point for the package structures illustrated in FIGS. 13, 19, and 20.

FIG. 21 is a diagram illustrating a relationship between the heating time and the temperature at the observation point x for the package structures 1-13, 1-19, and 1-20 illustrated in FIGS. 13, 19, and 20. In FIG. 21, the ordinate indicates the temperature (° C.) at the observation point x, and the abscissa indicates the heating time (min). In FIG. 21, p10, p13, p19, and p20 indicate the simulation results of the temperature at the observation point x for the package structures 201, 1-13, 1-19, and 1-20 illustrated in FIGS. 10, 13, 19, and 20. As illustrated in FIG. 21, it was confirmed that the package structures 1-19 and 1-20 illustrated in FIGS. 19 and 20 can simultaneously achieve light weight and heat resistance, by making the heat capacity of a part of the wall closer to the silicon device 10S, that is, by making the heat capacity of the inner wall 11 larger than the heat capacity of the outer wall 13. In the case of the package structure 1-13 illustrated in FIG. 13, the total weight is 13.9 g and is light compared to the total weight (32.7 g) of the reference package structure 201, and the heat resistance indicated by p13 in FIG. 21 is close to the heat resistance (p10) of the reference package structure 201 illustrated in FIG. 21. On the other hand, in the case of the package structures 1-19 and 1-20 illustrated in FIGS. 19 and 20, it was confirmed that the total weights are 21.9 g and 30.1 g, respectively, and are light compared to the total weight (32.7 g) of the reference package structure 201, and that the heat resistances indicated by p19 and p20 in FIG. 21 are improved from the heat resistance (p10) of the reference package structure 201 illustrated in FIG. 21.

The package structures 1-13, 1-19, and 1-20 illustrated in FIGS. 13, 19, and 20 may employ the two-wall structure in which the thickness of the outer wall 13 made of the resin is 1 mm and the thickness of the inner wall 11 is 3 mm. The inner wall 11 is made of the resin in the case of the package structure 1-13 illustrated in FIG. 13, made of the ceramics in the case of the package structure 1-19 illustrated in FIG. 19, and made of a metal-resin composite in the case of the package structure 1-20 illustrated in FIG. 20. The metal-resin composite may be formed by embedding silicon into a resin block having a diameter of 22 mm and a thickness of 2 mm, and embedding this resin block into a metal block having a diameter of 26 mm and a thickness of 6 mm, for example.

The temperature rise at the observation point x of the package structure 1-19 illustrated in FIG. 19 is slower than that of the reference package structure 201. The temperature rise at the observation point x of the package structure 1-20 illustrated in FIG. 20 is slower than that of the package structure 1-19 illustrated in FIG. 19. The heat capacity of the inner wall 11 is smaller than that of the outer wall 13 in the package structure 1-13 illustrated in FIG. 13, but the heat capacity of the inner wall 11 is larger than that of the outer wall 13 in the package structures 1-19 and 1-20 illustrated in FIGS. 19 and 20. The heat capacity of the inner wall 11 in the package structure 1-19 illustrated in FIG. 19 is larger than that of the package structure 1-20 illustrated in FIG. 20.

Figure 22:
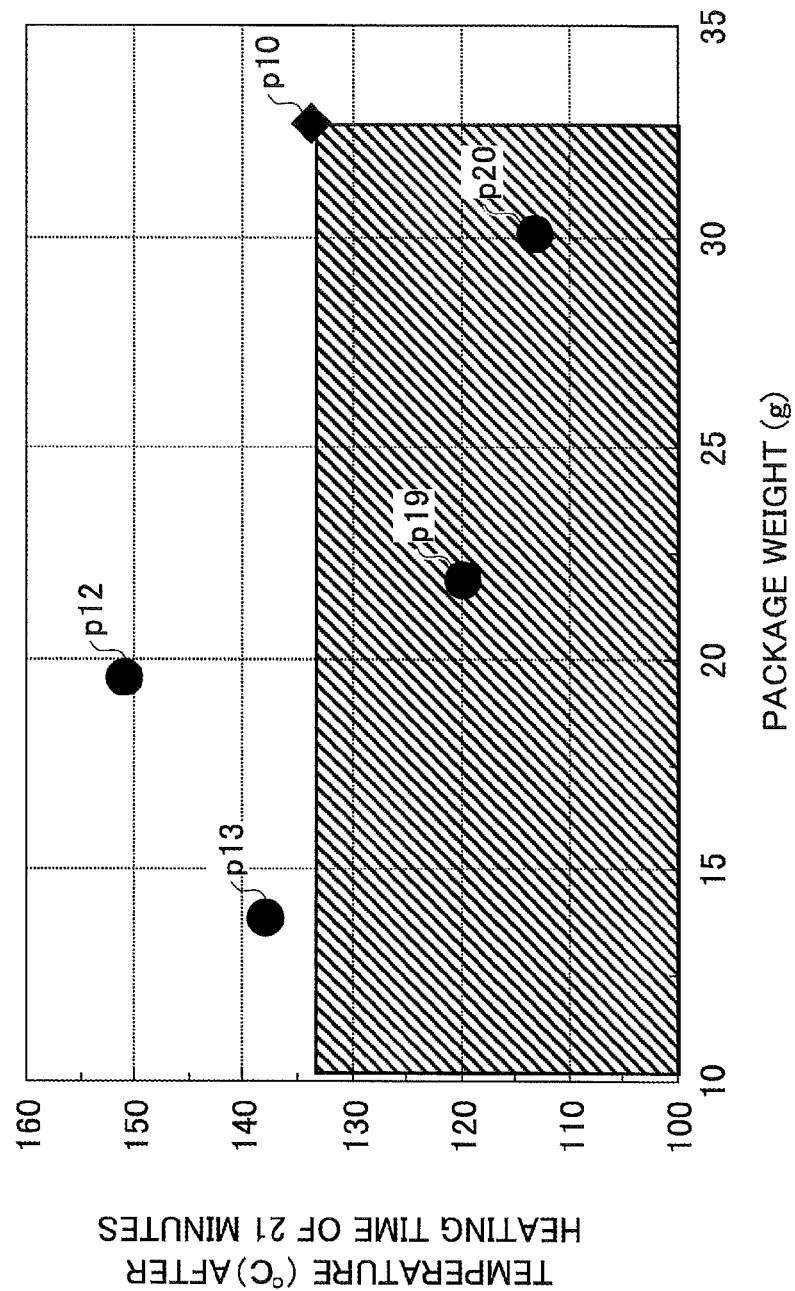
FIG. 22 is a diagram illustrating a relationship between the temperature and a package weight at the observation point x after the heating time of 21 minutes, for the package structures illustrated in FIGS. 10, 12, 13, 19, and 20.

FIG. 22 is a diagram illustrating a relationship between the temperature and a package weight (weight of the package structures 201, 1-12, 1-13, 1-19, and 1-20) at the observation point x after the heating time of 21 minutes, for the package structures 201, 1-12, 1-13, 1-19, and 1-20 illustrated in FIGS. 10, 12, 13, 19, and 20. In FIG. 22, a region in which data indicated by hatchings are surrounded by a bold solid line indicates a region in which the temperature is suppressed to approximately 135° C. or lower at the observation point x when a similar simulation is performed for the reference package structure 201, and the heat resistances of the package structures 1-19 and 1-20 that are lighter in weight than the reference package structure 201 are higher than that of the reference package structure 201. From the simulation results illustrated in FIG. 22, the data p10 of the reference package structure 201 illustrated in FIG. 10, and the data p12 and p13 of the package structures 1-12 and 1-13 illustrated in FIGS. 12 and 13 are located outside the region surrounded by the bold solid line. On the other hand, it was confirmed that the data p19 and p20 of the package structures 1-19 and 1-20 illustrated in FIGS. 19 and 20 are located inside the region surrounded by the bold solid line. Further, it was also confirmed that the total weights of the package structures 1-19 and 1-20 are 21.9 g and 30.1 g, respectively, and are light when compared to the total weight (32.7 g) of the reference package structure 201, and that the heat resistances indicated by the data p19 and p20 in FIG. 22 are improved compared to the heat resistance (p10) of the reference package structure 201.

Accordingly, from FIG. 22 which illustrates the correlation of the weight and the temperature at the observation point x for each of the reference package structure 201 illustrated in FIG. 10 and the package structures 1-12, 1-13, 1-19, and 1-20 illustrated in FIGS. 12, 13, 19, and 20, it was confirmed that employing the two-wall structure made up of the outer wall 13 and the inner wall 11, and making the wall (inner wall 11) at the part closer to the central part of the package structure thick, have the effect of simultaneously delaying the temperature rise (or improving the heat resistance) and achieving the light weight.

Figure 23:
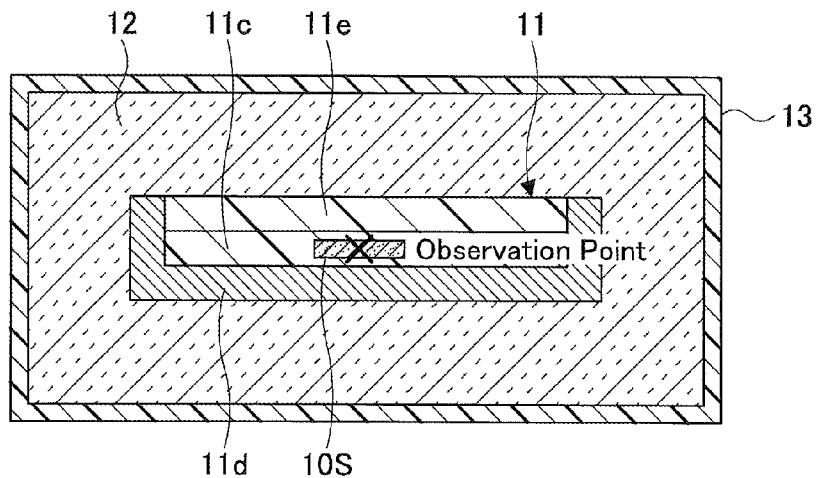
FIG. 23 is a cross sectional view illustrating an example of the package structure.

Next, in a package structure 1-23 illustrated in FIG. 23, the thickness of a resin inner part 11c of the inner wall 11 is 1 mm, the thickness of a metal outer part 11d of the inner wall 11 is 2 mm, the thickness of a resin part 11e on the resin inner part 11c does not protrude from the 2 mm thickness of the metal outer part 11d, the heat capacity of the inner wall 11 as a whole is 9.2 J/K. the thickness of the heat insulating material 12 is 6 mm, the heat capacity of the outer wall 13 made of the resin is 8.2 J/K, the thickness of the outer wall 13 is 1 mm, and the total weight of the package structure 1-23 is 20.8 g.

Figure 24:
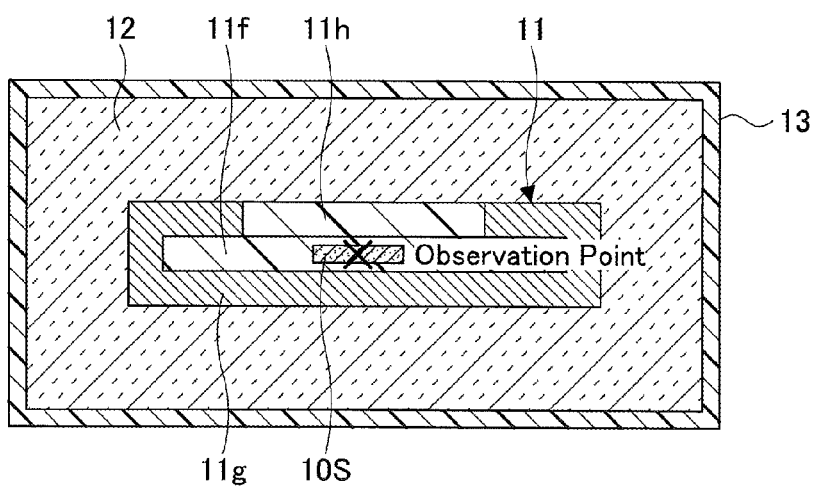
FIG. 24 is a cross sectional view illustrating an example of the package structure.

In a package structure 1-24 illustrated in FIG. 24, the thickness of a resin inner part 11f of the inner wall 11 is 1 mm, the thickness of a metal outer part 11g of the inner wall 11 is 2 mm, the thickness of a resin part 11h on the resin inner part 11f does not protrude from the 2 mm thickness of the metal outer part 11g, the heat capacity of the inner wall 11 as a whole is 10.1 J/K. the thickness of the heat insulating material 12 is 6 mm, the heat capacity of the outer wall 13 made of the resin is 8.2 J/K, the thickness of the outer wall 13 is 1 mm, and the total weight of the package structure 1-24 is 21.6 g.

The area (top surface area) of the resin part 11e forming the upper portion of the outer part of the inner wall 11 in the package structure 1-23 illustrated in FIG. 23 is larger than that of the resin part 11h of the package structure 1-23 illustrated in FIG. 24. By replacing a portion of the metal outer parts 11d and 11g of the inner walls 11 by the resin parts 11e and 11h, respectively, the wireless communication becomes possible between the package structure and the outside even in a case in which the antenna is provided within the semiconductor device 10. In FIGS. 23 and 24, the silicon device 10S is made of silicon. In simulations that perform the known thermal analysis, an initial temperature of the package structures 201, 1-23, and 1-24 is 30° C., and the temperature at the observation point x is obtained by arranging the package structures 201, 1-23, and 1-24 in an environment in which the temperature on the outside is 200° C. and constant.

Figure 25:
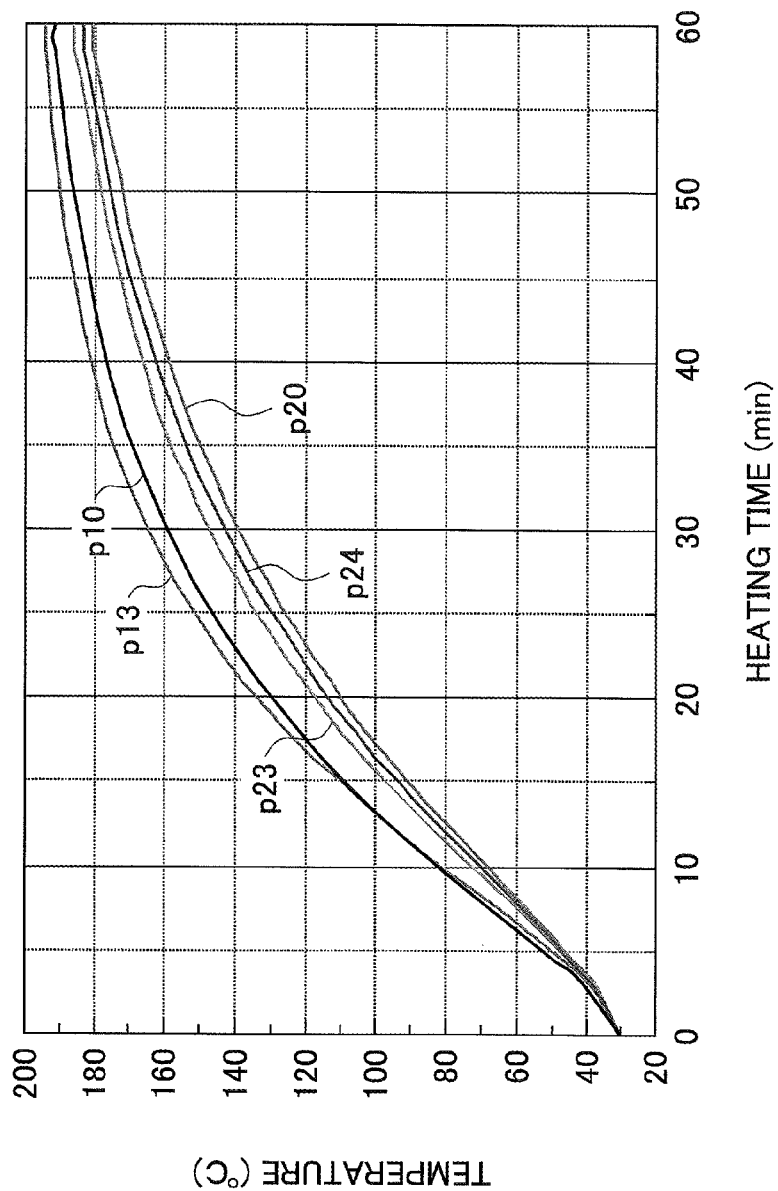
FIG. 25 is a diagram illustrating a relationship between the heating time and the temperature at the observation point for the package structures illustrated in FIGS. 10, 13, 20, 23, and 24.

FIG. 25 is a diagram illustrating a relationship between the heating time and the temperature at the observation point x for the package structures 201, 1-13, 1-20, 1-23, and 1-24 illustrated in FIGS. 10, 13, 20, 23, and 24. In FIG. 25, the ordinate indicates the temperature (° C.) at the observation point x, and the abscissa indicates the heating time (min). In FIG. 25, p10, p13, p20, p23, and p24 indicate the simulation results of the temperature at the observation point x for the package structures 201, 1-13, 1-20, 1-23, and 1-24 illustrated in FIGS. 10, 13, 20, 23, and 24. As illustrated in FIG. 25, it was confirmed that even in the case in which a portion of the metal outer part of the inner wall 11 is replaced by the resin part, the wireless communication becomes possible between the package structure and the outside, and that it is possible to simultaneously achieve light weight and heat resistance. In the case of the package structure 1-23 illustrated in FIG. 23, the total weight is 20.8 g and is light compared to the total weight (32.7 g) of the reference package structure 201, and the heat resistance indicated by p23 in FIG. 25 is improved from the heat resistance (p10) of the reference package structure 201 illustrated in FIG. 25 and is close to the heat resistance (p20) of the package structure 1-20 illustrated in FIG. 20. Similarly, in the case of the package structure 1-24 illustrated in FIG. 24, the total weight is 21.6 g and is light compared to the total weight (32.7 g) of the reference package structure 201, and the heat resistance indicated by p24 in FIG. 25 is improved from the heat resistance (p10) of the reference package structure 201 illustrated in FIG. 25 and is close to the heat resistance (p20) of the package structure 1-20 illustrated in FIG. 20.

The package structures 1-13, 1-20, 1-23, and 1-24 illustrated in FIGS. 13, 20, 23, and 24 may employ the two-wall structure in which the thickness of the outer wall 13 made of the resin is 1 mm and the thickness of the inner wall 11 is 3 mm. The inner wall 11 is made of the resin in the case of the package structure 1-13 illustrated in FIG. 13, made of the metal-resin composite in the case of the package structure 1-20 illustrated in FIG. 20, made of a metal-resin composite in the case of the package structure 1-23 illustrated in FIG. 23 in which a part of the metal (for example, a part having a diameter of 22 mm and a thickness of 2 mm) in the package structure 1-20 illustrated in FIG. 20 is replaced by the resin, and made of a metal-resin composite in the case of the package structure 1-24 illustrated in FIG. 24 in which a part of the metal (for example, a part having a diameter of 14 mm and a thickness of 2 mm) in the package structure 1-20 illustrated in FIG. 20 is replaced by the resin. The metal-resin composite of the package structure 1-20 illustrated in FIG. 20 may be formed by embedding silicon into a resin block having a diameter of 22 mm and a thickness of 2 mm, and embedding this resin block into a metal block having a diameter of 26 mm and a thickness of 6 mm, for example.

The temperature rise at the observation point x of the package structures 1-20, 1-23, and 1-24 illustrated in FIGS. 20, 23, and 24 is slower than that of the reference package structure 201. The temperature rise at the observation point x becomes slower for the package structures 1-23, 1-24, and 1-20 illustrated in FIGS. 23, 24, and 20, in this order. In addition, the heat capacity of the inner wall 11 becomes larger for the package structures 1-23, 1-24, and 1-20 illustrated in FIGS. 23, 24, and 20, also in this order.

The passive RFID tag, that does not include a battery as a power supply, may include a semiconductor device, such as a semiconductor memory, a control circuit, an antenna, or the like, as illustrated in FIGS. 6 and 7. The RFID tag may communicate using the magnetic field or radio waves (electromagnetic field). In general, each of the magnetic field and the electromagnetic field loses energy in the form of heat or the like when passing through a metal (or conductor). In addition, the phase, wavelength, or the like of each of the magnetic field and the electromagnetic field vary when passing through a magnetic substance. In other words, the metal or magnetic substance acts as a barrier with respect to the communication, and it is preferable not to communicate through the metal or magnetic substance. For this reason, when embedding the constituent elements of the RFID tag in the inner wall, at least a part of the outer wall, or at least a part of the inner wall 11, is preferably made of a nonmetal or nonmagnetic material, such as a resin, ceramics, or the like, as in the case of the package structures 1-13 and 1-19 illustrated in FIGS. 13 and 19, or the package structures 1-23 and 1-24 illustrated in FIGS. 23 and 24.

In each of the embodiments described above, the resin forming the inner wall 11 and the resin forming the outer wall 13 may have the same composition or may have different compositions, as long as the heat capacity of the inner wall 11 is larger than the heat capacity of the outer wall 13. In addition, the metal part 11B forming a part of the inner wall 11, the metal part 13B forming a part of the outer wall 13, the metal forming the antenna 101, and the metal forming the data reading electrodes may have the same composition, or may have different compositions, or may partially have the same composition.

According to the embodiments, the heat resistance of the package structure can be improved without increasing the weight of the package structure. In addition, heat resistance of the package structure can be improve without increasing the package size. Hence, it is possible to simultaneously reduce the weight and improve the heat resistance, while maintaining the volume of the package structure unchanged.

Although the embodiments are numbered with, for example, "first," "second," "third," "fourth," or "fifth," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A package structure comprising:
a first member that surrounds a semiconductor device;
a heat insulating material that surrounds an outer side of the first member; and
a second member that surrounds an outer side of the heat insulating material,
wherein the heat insulating material has a density and a thermal conductivity lower than densities and thermal conductivities of the first and second members, and
wherein the first member has a heat capacity larger than a heat capacity of the second member.

2. The package structure as claimed in claim 1, wherein the semiconductor device includes a semiconductor memory.

3. The package structure as claimed in claim 2, wherein the semiconductor device further includes an antenna, and the first member includes a part formed by a metal and forming at least a part of the antenna.

4. The package structure as claimed in claim 3, wherein the part of the first member formed by the metal opposes the part of the second member formed by the nonmetal or nonmagnetic material via the heat insulating material.

5. The package structure as claimed in claim 2, wherein the second member includes a part formed by a nonmetal or nonmagnetic material.

6. The package structure as claimed in claim 5, further comprising:
an antenna that is provided on the outer side of the first member and on the inner side of the second member.

7. The package structure as claimed in claim 6, wherein the antenna is arranged between the first member and the part of the second member formed by the nonmetal or nonmagnetic material.

8. The package structure as claimed in claim 6, wherein the semiconductor device and the antenna form an RFID (Radio Frequency IDentification) tag.

9. The package structure as claimed in claim 5, wherein the semiconductor device further includes an antenna, and the first member includes a part formed by a nonmetal or nonmagnetic material.

10. The package structure as claimed in claim 9, where the part of the first member formed by the nonmetal or nonmagnetic material opposes the part of the second member formed by the nonmetal or nonmagnetic material via the heat insulating material.

11. The package structure as claimed in claim 1, wherein the semiconductor device includes an antenna, and the second member includes a part formed by a metal and forming at least a part of the antenna.

12. The package structure as claimed in claim 1, wherein the semiconductor device comprises a sensor device.

13. The package structure as claimed in claim 1, wherein the semiconductor device includes data reading electrodes, and the second member includes a part formed by a metal and forming at least a part of the data reading electrodes.

14. The package structure as claimed in claim 13, wherein the semiconductor device includes one or a plurality of sensors.

15. The package structure as claimed in claim 1, wherein the heat insulating material is made of made of an electrically insulating material.

* * * * *